US010052756B2

(12) United States Patent
Kuribayashi et al.

(10) Patent No.: US 10,052,756 B2
(45) Date of Patent: Aug. 21, 2018

(54) INDUSTRIAL ROBOT

(71) Applicant: NIDEC SANKYO CORPORATION, Suwa-gun, Nagano (JP)

(72) Inventors: Tamotsu Kuribayashi, Nagano (JP); Yasuyuki Kitahara, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 0 days.

(21) Appl. No.: 15/523,000

(22) PCT Filed: Oct. 21, 2015

(86) PCT No.: PCT/JP2015/079631
§ 371 (c)(1),
(2) Date: Apr. 28, 2017

(87) PCT Pub. No.: WO2016/067983
PCT Pub. Date: May 6, 2016

(65) Prior Publication Data
US 2017/0312915 A1 Nov. 2, 2017

(30) Foreign Application Priority Data

Oct. 30, 2014 (JP) ................. 2014-221541

(51) Int. Cl.
*B25J 9/06* (2006.01)
*B25J 9/04* (2006.01)
(52) U.S. Cl.
CPC ................. *B25J 9/06* (2013.01); *B25J 9/043* (2013.01); *B25J 9/042* (2013.01)

(58) Field of Classification Search
CPC ...................................... H01L 21/677
See application file for complete search history.

(56) References Cited

U.S. PATENT DOCUMENTS 5,789,890 A * 8/1998 Genov ............... B25J 9/1615
414/744.1
6,400,115 B1 * 6/2002 Yamazoe ............. B25J 9/042
901/46
RE45,772 E * 10/2015 Hashimoto ....... H01L 21/67766

FOREIGN PATENT DOCUMENTS

JP 2008028134 A * 2/2008 ....... H01L 21/67766
JP 2008028134 A 2/2008
(Continued)

OTHER PUBLICATIONS

International Search Report corresponding to Application No. PCT/JP2015/079631; dated Dec. 22, 2015, with English translation.

*Primary Examiner* — Gerald McClain
(74) *Attorney, Agent, or Firm* — Cantor Colburn LLP

(57) ABSTRACT

An industrial robot may include a main body; a hand; and an arm having a top end side and a root end side, the top end side being rotatably connected to the hand and the root end side being rotatably connected to the main body. The arm may include a first part having a top end side and a root end side; and a second arm part having a top end side. The hand may be rotatably connected to the top end side of the first arm part. The root end side of the first arm part may rotatably connected to the top end side of the second arm part. The top end side of the first arm part is a reducing-width part where a width gradually narrows in a direction from the root end side of the first top-end-side arm part to the top end side.

4 Claims, 4 Drawing Sheets

(56) References Cited

FOREIGN PATENT DOCUMENTS

| | | | |
|---|---|---|---|
| JP | 2011230256 | A | 11/2011 |
| WO | 2008065747 | A1 | 6/2008 |

* cited by examiner

US 10,052,756 B2

INDUSTRIAL ROBOT

CROSS REFERENCE TO RELATED APPLICATIONS

This is the U.S. national stage of application No. PCT/JP2015/079631, filed on Oct. 21, 2015. Priority under 35 U.S.C. § 119(a) and 35 U.S.C. § 365(b) is claimed from Japanese Application No. 2014-221541, filed on Oct. 30, 2014, the disclosure of which is incorporated herein by reference.

FIELD OF THE INVENTION

At least an embodiment of the present invention relates to an industrial robot for transferring a semiconductor wafer between a Front Open Unified Pod (FOUP) and a semiconductor wafer processing device, the industrial robot constituting a part of an Equipment Front End Module (EFEM).

BACKGROUND

Conventionally known is an industrial robot that constitutes a part of an EFEM, and transfers a semiconductor wafer between a FOUP and a semiconductor wafer processing device (for example, refer to Patent Document 1). An industrial robot described in Patent Document 1 includes a hand on which a semiconductor wafer is mounted, an arm to which the hand is connected at a top end side of the arm in such a way as to be rotatable, and a main body to which a root end side of the arm is connected in such a way as to be rotatable. The arm includes three arm parts; that is to say, a first arm part whose root end side is connected to the main body in such a way as to be rotatable, a second arm part whose root end side is connected to a top end side of the first arm part in such a way as to be rotatable, and a third arm part whose root end side is connected to a top end side of the second arm part in such a way as to be rotatable, wherein the hand is connected to a top end side of the third arm part in such a way as to be rotatable.

Patent Document

Patent Document 1; Japanese Unexamined Patent Application Publication No. 2011-230256

With regard to a semiconductor manufacturing system in which an industrial robot, described in Patent Document 1, and others are employed; in recent years, there is an increased need for enlarging a workspace of the industrial robot in comparison to a footprint of the industrial robot. In order to enlarge a workspace of an industrial robot in comparison to a footprint of the industrial robot, it is only needed to elongate each arm part length of a first arm part 118, a second arm part 119, and a third arm part 120 that constitute an arm 116, and to make a rotation center C101 of the arm 116 in relation to a main body 117 closer to a side of a FOUP 108 (or a side of a semiconductor wafer processing device 107), as shown in FIG. 4.

It has been discovered through consideration that unfortunately, if each arm part length of the first arm part 118 through the third arm part 120 is elongated and the rotation center C101 is made closer to the side of the FOUP 108 (or the side of the semiconductor wafer processing device 107), a top end side of the third arm part 120, to which a hand 115 is connected, collides with a wall part 110a of a chassis 110 of an EFEM in which an industrial robot 101 is housed, so that sometimes a semiconductor wafer 102 cannot appropriately be transferred, for example, as a section "E" if FIG. 4 shows.

SUMMARY

Then, at least an embodiment of the present invention provides an industrial robot that can appropriately transfer a semiconductor wafer even in the case where each arm part length of arm parts that constitute an arm is elongated and a rotation center of an arm in relation to a main body is made closer to a side of a FOUP or a side of a semiconductor wafer processing device.

To achieve the above, an industrial robot according to at least an embodiment of the present invention is an industrial robot for transferring a semiconductor wafer between a Front Open Unified Pod (FOUP) and a semiconductor wafer processing device, the industrial robot constituting a part of an Equipment Front End Module (EFEM), and comprising: a hand on which the semiconductor wafer is mounted; an arm to which the hand is connected at a top end side of the arm in such a way as to be rotatable; and a main body to which a root end side of the arm is connected in such a way as to be rotatable; wherein, the arm includes a top-end-side arm part to which the hand is connected at a top end side in such a way as to be rotatable, and a second top-end-side arm part to which a root end side of the top-end-side arm part is connected at a top end side in such a way as to be rotatable; at least the top end side of the top-end-side arm part is a reducing-width part where a width gradually becomes narrower as a location closes toward a top end of the top-end-side arm part in a view from a vertical direction; the top end of the top-end-side arm part is shaped so as to be almost arc-like in the view from the vertical direction; the FOUP and the semiconductor wafer processing device are placed in such a way as to face each other across the EFEM in a first direction that is perpendicular to a vertical direction; and where a radius of curvature of the top end of the top-end-side arm part in the view from the vertical direction is referred to as a radius R; an angle of the reducing-width part in the view from the vertical direction is referred to as an angle α; a flat wall surface being at a side toward the FOUP, which constitutes one internal surface, in the first direction, of a chassis of the EFEM housing the industrial robot, is referred to as a first wall surface; a flat wall surface being at a side toward the semiconductor wafer processing device, constituting the other internal surface, in the first direction, of the chassis of the EFEM, and being in parallel with the first wall surface, is referred to as a second wall surface; a rotation center of the hand in relation to the top-end-side arm part in the view from the vertical direction is referred to as a first rotation center; a rotation center of the top-end-side arm part in relation to the second top-end-side arm part in the view from the vertical direction is referred to as a second rotation center; a line connecting the first rotation center and the second rotation center in the view from the vertical direction is referred to as an arm part center line; a length of the arm part center line in the view from the vertical direction is referred to as a length L; an angle of the arm part center line in relation to the first wall surface in the view from the vertical direction, at a time just after the industrial robot has finished bringing the semiconductor wafer into the FOUP, is referred to as a first angle θ1; an angle of the arm part center line in relation to the second wall surface in the view from the vertical direction, at a time just after the industrial robot has finished bringing the semiconductor wafer into the semiconductor wafer processing device, is referred to as a second angle θ2; a distance between the second rotation center and the first wall surface, in the first direction, at the time just after the industrial robot has finished bringing the semiconductor wafer into the FOUP, is referred to as a distance d1; and a distance between the second rotation center and the second wall surface, in the first direction, at the time just after the industrial robot has finished bringing the semiconductor wafer into the semiconductor wafer processing device, is referred to as a distance d2; relationships of formulas of "L×sin θ1<d1−R" and "L×sin θ2<d2−R" are established; moreover, a relationship of a formula of "α≤2× θ1" is established, in the case where the first angle θ1 is smaller than the second angle θ2; and a relationship of a formula of "α≤2×θ 2" is established, in the case where the second angle θ2 is smaller than the first angle θ1.

In the case of the industrial robot according to at least an embodiment of the present invention, the relationships of the formulas of "L×sin θ1<d1−R" and "L×sin θ2<d2−R" are established; moreover, the relationship of the formula of "α≤2×θ1" is established, in the case where the first angle θ1 is smaller than the second angle θ2; and the relationship of the formula of "α≤2×θ2" is established, in the case where the second angle θ2 is smaller than the first angle θ1. Therefore, according to at least an embodiment of the present invention, even in the case where each arm part length of the arm parts that constitute the arm is elongated and the rotation center of the arm in relation to the main body is made closer to the side of the FOUP or the side of the semiconductor wafer processing device, it becomes possible to avoid an interference between the top-end-side arm part and either the first wall surface or the second wall surface; and as a result of that, it becomes possible to appropriately transfer a semiconductor wafer.

In at least an embodiment of the present invention, for example; a first joint part as a connection part, connecting the top-end-side arm part and the hand, is provided with a first bearing unit for supporting the hand in such a way as to make the hand rotatable in relation to the top-end-side arm part, and either a pulley or a gear for transmitting the power in order to turn the hand in relation to the arm top-end-side arm part; in the case where the first joint part is provided with the pulley, a center of the pulley and a center of the first bearing unit coincide with the first rotation center in a view from a vertical direction; in the case where the first joint part is provided with the gear, a center of the gear and the center of the first bearing unit coincide with the first rotation center in the view from the vertical direction; a second joint part as a connection part, connecting the second top-end-side arm part and the top-end-side arm part, is provided with a second bearing unit for supporting the top-end-side arm part in such a way as to make the top-end-side arm part rotatable in relation to the second top-end-side arm part; a center of the second bearing unit coincides with the second rotation center in the view from the vertical direction; where an outer diameter of the first bearing unit is represented as an outer diameter D1, an outer diameter of the pulley is represented as an outer diameter D2, and an outer diameter of the gear is represented as an outer diameter D3, an outer diameter of the second bearing unit is greater than the outer diameter D1, the outer diameter D2, and the outer diameter D3; in the case where the first joint part is provided with the pulley, and the outer diameter D1 is greater than the outer diameter D2, or in the case where the first joint part is provided with the gear, and the outer diameter D1 is greater than the outer diameter D3, the angle α is equal to or greater than an angle between two external common tangents that contact an outer periphery of the first bearing unit and an outer periphery of the second bearing unit, in the view from the vertical direction; in the case where the first joint part is provided with the pulley, and the outer diameter D2 is greater than the outer diameter D1, the angle α is equal to or greater than an angle between two external common tangents that contact an outer periphery of the pulley and the outer periphery of the second bearing unit, in the view from the vertical direction; and in the case where the first joint part is provided with the gear, and the outer diameter D3 is greater than the outer diameter D1, the angle α is equal to or greater than an angle between two external common tangents that contact an outer periphery of the gear and the outer periphery of the second bearing unit, in the view from the vertical direction.

In at least an embodiment of the present invention; the arm is, for example, structured with three arm parts including the top-end-side arm part, the second top-end-side arm part, and a root-end-side arm part to which a root end side of the second top-end-side arm part is connected at a top end side in such a way as to be rotatable.

As described above, it becomes possible for the industrial robot according to at least an embodiment of the present invention to appropriately transfer a semiconductor wafer even in the case where each arm part length of the arm parts that constitute the arm is elongated and the rotation center of the arm in relation to the main body is made closer to the side of the FOUP or the side of the semiconductor wafer processing device.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

An embodiment of the present invention is explained below with reference to the accompanying drawings.
(General Configuration of a Semiconductor Manufacturing System and an Industrial Robot)

Figure 1:
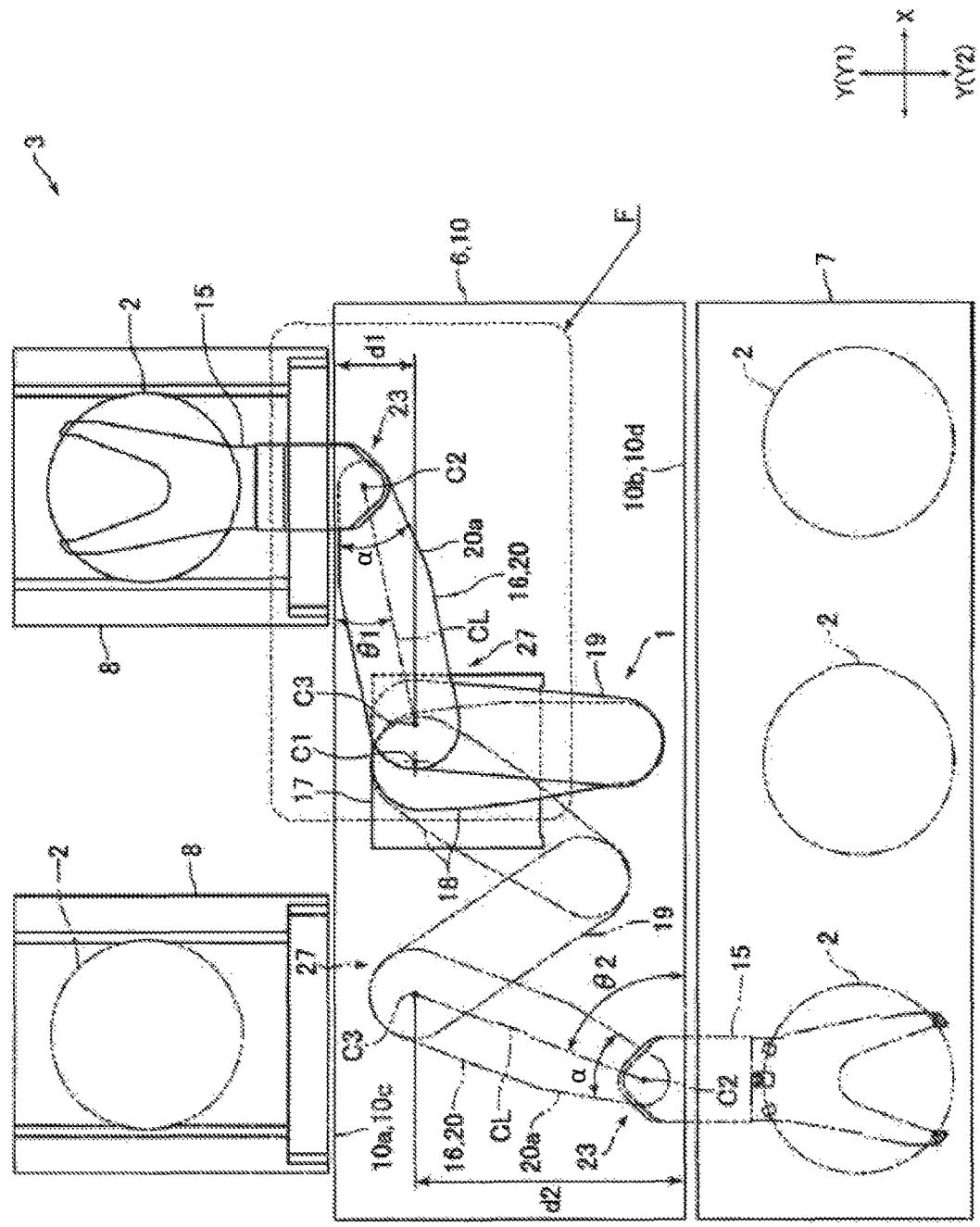
FIG. 1 is a schematic plan view of a semiconductor manufacturing system in which an industrial robot according to an embodiment of the present invention is used.
Figure 2:
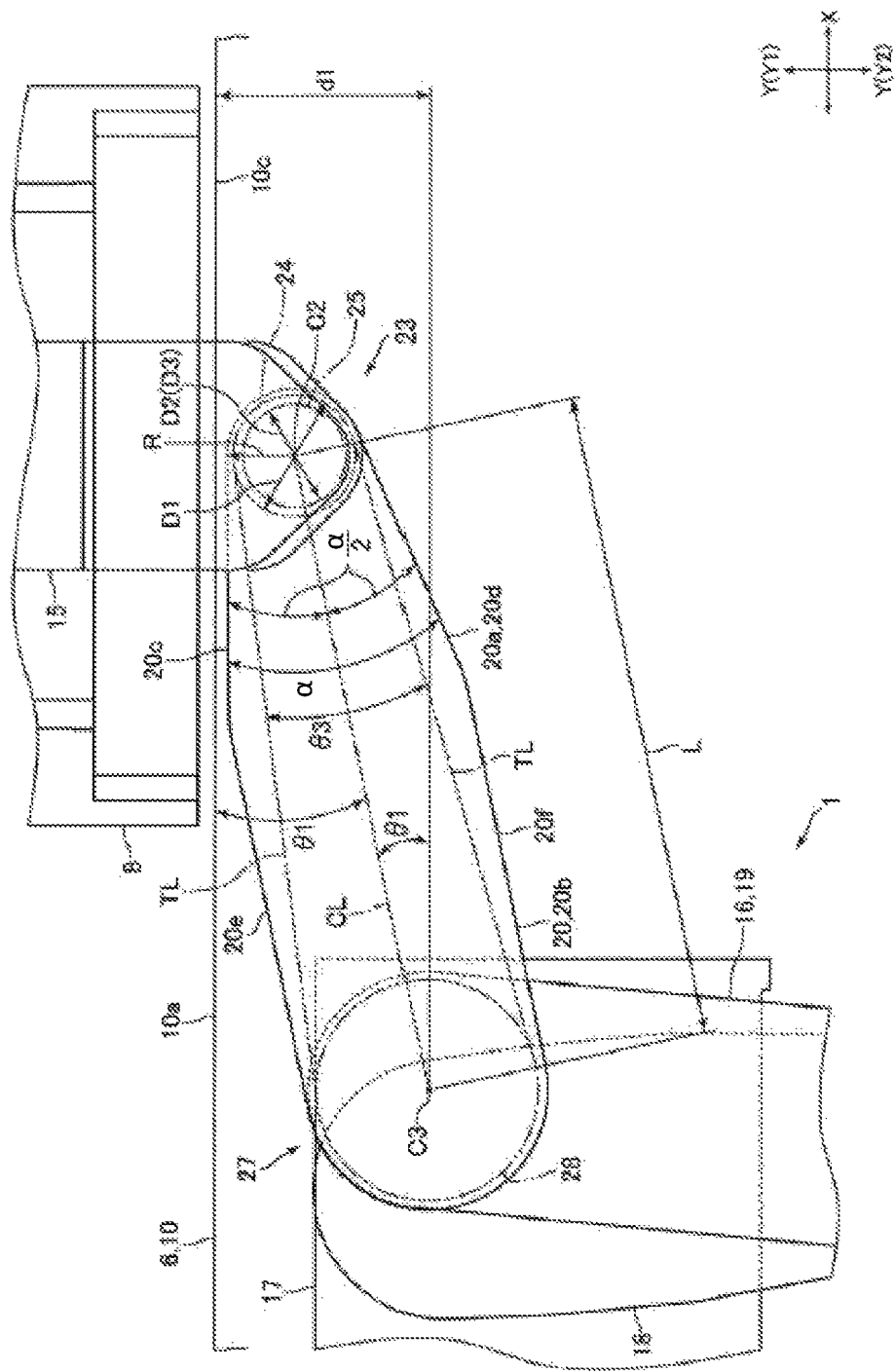
FIG. 2 is a magnified view of a section "F" in FIG. 1.

FIG. 1 is a schematic plan view of a semiconductor manufacturing system 3 in which an industrial robot 1 according to an embodiment of the present invention is used. FIG. 2 is a magnified view of a section "F" in FIG. 1.

An industrial robot 1 according to the present embodiment is a SCARA robot (Selective Compliance Assembly Robot Arm) for transferring a semiconductor wafer 2, wherein the industrial robot 1 is used while being built in the semiconductor manufacturing system 3. In the explanation described below, the industrial robot 1 and the semiconductor wafer 2 are represented as a 'robot 1' and a 'wafer 2', respectively. Moreover, in the explanation described below, an X-direction in FIG. 1 that is perpendicular to a vertical direction is represented as a 'right-and-left direction', and meanwhile a Y-direction in FIG. 1 that is perpendicular to the vertical direction as well as the right-and-left direction is represented as a 'back-and-forth direction', and then a Y1-direction side and a Y2-direction side are represented as a front side and a rear side, respectively.

As shown in FIG. 1, the semiconductor manufacturing system 3 are provided with an EFEM 6 and a semiconductor wafer processing device 7 that executes a predetermined process for the wafer 2. The EFEM 6 is placed at a front side of the semiconductor wafer processing device 7. The robot 1 constitutes a part of the EFEM 6. Furthermore, the EFEM 6 is provided with a load port (not shown) for opening and closing a FOUP 8, and a chassis 10 for housing the robot 1. The chassis 10 is shaped so as to be a parallelepiped box being elongated in a right-and-left direction. A front wall 10a constituting a front side part of the chassis 10, and a rear wall 10b constituting a rear side part of the chassis 10 are each formed as a plate being perpendicular to a back-and-forth direction. An internal section of the chassis 10 is a clean space.

Being manufactured in accordance with SEMI (Semiconductor Equipment and Materials Institute) standards, the FOUP 8 is able to store 25 or 13 wafers 2. The load port for opening and closing the FOUP 8 is placed at a front side of the chassis 10; and the semiconductor wafer processing device 7 and the FOUP 8 are placed in such a way as to face each other across the EFEM 6. In the present embodiment, there are placed two load ports, having a predetermined space between the two, in a right-and-left direction. Then, the robot 1 transfers the wafer 2 between the FOUP 8 and the semiconductor wafer processing device 7.

The back-and-forth direction (the Y-direction) in the present embodiment is a first direction. Meanwhile, in the present embodiment, a rear side surface 10c of the front wall 10a is a flat wall surface constituting one internal surface of the chassis 10 in a back-and-forth direction, the flat wall surface being at a side toward the FOUP 8, and being represented as a first wall surface. Then, in the present embodiment, a front side surface 10d of the rear wall 10b is a flat wall surface constituting the other internal surface of the chassis 10 in the back-and-forth direction, the flat wall surface being in parallel with the rear side surface 10c as the first wall surface, and being at a side toward the semiconductor wafer processing device 7, and the front side surface 10d being represented as a second wall surface.

The robot 1 includes; a hand 15 on which wafer 2 is mounted, an arm 16 to which the hand 15 is connected at a top end side in such a way as to be rotatable, and a main body 17 to which a root end side of the arm 16 is connected in such a way as to be rotatable. The arm 16 includes three arm parts 18 through 20; that is to say, the arm part 18 whose root end side is connected to the main body 17 in such a way as to be rotatable, the arm part 19 whose root end side is connected to a top end side of the arm part 18 in such a way as to be rotatable, and the arm part 20 whose root end side is connected to a top end side of the arm part 19 in such a way as to be rotatable. In the meantime, a root end side of the hand 15 is connected to a top end side of the arm part 20. The arm part 18 in the present embodiment is a root-end-side arm part, the arm part 19 is a second top-end-side arm part, and the arm part 20 is a top-end-side arm part. Incidentally, the number of hands 15 to be connected to the top end side of the arm 16 may be one or two.

The hand 15 is shaped so as to have an approximate Y-shape form in a view from a vertical direction, and the wafer 2 is mounted at a top end part of the hand 15 being Y-shaped. The arm parts 18 through 20 are formed so as to be hollow. Meanwhile, in the present embodiment, a length of the arm part 18, a length of the arm part 19, and a length of the arm part 19 are identical. The main body 17, the arm part 18, the arm part 19, the arm part 20, and the hand 15 are positioned in this order from a lower elevation in a vertical direction. Inside the main body 17, there is housed an arm elevating mechanism (not shown) for lifting up and down the hand 15 and the arm 16. In a view from a vertical direction, a rotation center C1 of the arm part 18 with respect to the main body 17 (namely, a rotation center of the arm 16 with respect to the main body 17) is placed at a front side in relation to a center position of the chassis 10 in a back-and-forth direction.

Furthermore, the robot 1 includes; an arm part drive mechanism for expanding/contracting a part of the arm 16, composed of the arm part 18 and the arm part 19, by way of turning the arm part 18 and the arm part 19 together; an arm drive mechanism for turning the arm part 20; and a hand drive mechanism for turning the hand 15.

A joint part 23 as a connection part, connecting the hand 15 and the arm part 20, includes a bearing unit 24 for supporting the hand 15 in such a way as to make the hand 15 rotatable in relation to the arm part 20, and a pulley 25 for transmitting the power in order to turn the hand 15 in relation to the arm part 20 (refer to FIG. 2). The pulley 25 makes up a part of the hand drive mechanism. Where a rotation center of the hand 15 in relation to the arm part 20 in a view from a vertical direction is referred to as a rotation center C2, the bearing unit 24 and the pulley 25 are coaxially placed in such a way that a center of the bearing unit 24 and a center of the pulley 25 coincide with the rotation center C2 in the view from the vertical direction. The joint part 23 in the present embodiment is a first joint part, and meanwhile the bearing unit 24 is a first bearing unit. In the meantime, the rotation center C2 in the present embodiment is a first rotation center.

A joint part 27 as a connecting section between the arm part 19 and the arm part 20 is provided with a bearing unit 28 for supporting the arm part 20 in such a way as to make the arm part 20 rotatable in relation to the arm part 19. Where a rotation center of the arm part 20 in relation to the arm part 19 in a view from a vertical direction is referred to as a rotation center C3, the bearing unit 28 is placed in such a way that a center of the bearing unit 28 coincides with the rotation center C3 in the view from the vertical direction. Meanwhile, an outer diameter of the bearing unit 28 is larger than an outer diameter of the bearing unit 24 and an outer diameter of the pulley 25. The joint part 27 in the present embodiment is a second joint part, and the bearing unit 28 is a second bearing unit. In the meantime, the rotation center C3 in the present embodiment is a second rotation center.

Incidentally, in the present embodiment, the arm part drive mechanism collectively turns the arm part 18 and the arm part 19 in such a way that a trajectory of the rotation center C3 in the view from the vertical direction results in a line in parallel with a right-and-left direction. Concretely to describe, the arm part drive mechanism collectively turns the arm part 18 and the arm part 19 in such a way that the trajectory of the rotation center C3 in the view from the vertical direction results in a line in parallel with the right-and-left direction, wherein the line passes through the rotation center C1.

(Configuration of Top End Side of the Arm Part)

The arm part 20 is configured with a reducing-width part 20a where a width gradually becomes narrower as a location closes toward a top end of the arm part 20 in a view from a vertical direction, and a constant-width part 20b where a width is constant in the same view. Concretely to describe, where a line connecting the rotation center C2 and the rotation center C3 in the view from the vertical direction is referred to as an arm part center line CL, the arm part 20 is configured with the reducing-width part 20a where a width in a direction perpendicular to the arm part center line CL (namely, in a direction perpendicular to a direction from a root end of the arm part 20 toward a top end) gradually becomes narrower as a location closes toward the top end of the arm part 20 in the view from the vertical direction, and the constant-width part 20b where a width in the direction perpendicular to the arm part center line CL is constant in the same view. Incidentally, as described above, the arm part 20 is so formed as to be hollow; and inside the arm part 20, there are placed a motor for making up the hand drive mechanism, a belt for transmitting the power of the motor to the pulley 25, and a tension pulley for adjusting a tension of the belt, and the like.

The reducing-width part 20a makes up a top end side part of the arm part 20, and meanwhile the constant-width part 20b makes up a root end side part of the arm part 20. The root end and the top end of the arm part 20 are each shaped so as to be almost arc-like in the view from the vertical direction. Moreover, the arm part 20 is so shaped as to be line-symmetric with respect to the arm part center line CL as a symmetrical axis in the view from the vertical direction. In other words, where an angle of the reducing-width part 20a (specifically, an angle between one side surface 20c and the other side surface 20d in the direction perpendicular to the arm part center line CL) in the view from the vertical direction is referred to as an angle $\alpha$ as shown in FIG. 2, an angle between the arm part center line CL and the one side surface 20c is $\alpha/2$ in the view from the vertical direction, and meanwhile an angle between the arm part center line CL and the other side surface 20d is $\alpha/2$ in the same view. Furthermore, in the constant-width part 20b, in the view from the vertical direction; a distance between one side surface 20e and the arm part center line CL in the direction perpendicular to the arm part center line CL is equal to a distance between the other side surface 20f and the arm part center line CL in the direction perpendicular to the arm part center line CL.

Then, a radius of curvature of the top end of the arm part 20 in the view from the vertical direction is referred to as a radius R; a length of the arm part center line CL in the view from the vertical direction is referred to as a length L; an angle of the arm part center line CL in relation to the rear side surface 10c in the view from the vertical direction, at a time just after the robot 1 has finished bringing the wafer 2 into the FOUP 8 (a situation as illustrated with a solid line in FIG. 1), is referred to as a first angle $\theta 1$; an angle of the arm part center line CL in relation to the front side surface 10d in the view from the vertical direction, at a time just after the robot 1 has finished bringing the wafer 2 into the semiconductor wafer processing device 7 (a situation as illustrated with a two-dot chain line in FIG. 1), is referred to as a second angle $\theta 2$; a distance between the rotation center C3 and the rear side surface 10c, in a back-and-forth direction, at the time just after the robot 1 has finished bringing the wafer 2 into the FOUP 8, is referred to as a distance d1; and a distance between the rotation center C3 and the front side surface 10d, in the back-and-forth direction, at the time just after the robot 1 has finished bringing the wafer 2 into the semiconductor wafer processing device 7, is referred to as a distance d2.

Relationships of formulas of "L×sin $\theta 1$<d1−R" and "L×sin $\theta 2$<d2−R" are established in the present embodiment. Moreover, in the present embodiment, the first angle $\theta 1$ is smaller than the second angle $\theta 2$, and then a distance between the one side surface 20c (or the other side surface 20d) of the reducing-width part 20a of the arm part 20 and the rear side surface 10c, at the time just after the robot 1 has finished bringing the wafer 2 into the FOUP 8, is shorter than a distance between the one side surface 20c (or the other side surface 20d) and the front side surface 10d, at the time just after the robot 1 has finished bringing the wafer 2 into the semiconductor wafer processing device 7. Meanwhile, a relationship of a formula of "$\alpha=2\times\theta 1$" is established in the present embodiment; and in a view from a vertical direction, at the time just after the robot 1 has finished bringing the wafer 2 into the FOUP 8, the one side surface 20c (or the other side surface 20d) and the rear side surface 10c are parallel to each other, and there is formed a clearance between the one side surface 20c (or the other side surface 20d) and the rear side surface 10c.

Primary Advantageous Effect of the Present Embodiment

As explained above, in the present embodiment, the relationships of the formulas of "L×sin $\theta 1$<d1−R" and "L×sin $\theta 2$<d2−R" are established, and moreover the relationship of the formula of "$\alpha=2\times\theta 1$" is established; and then in the view from the vertical direction, at the time just after the robot 1 has finished bringing the wafer 2 into the FOUP 8, the one side surface 20c (or the other side surface 20d) and the rear side surface 10c are parallel to each other, and there is formed a clearance between the one side surface 20c (or the other side surface 20d) and the rear side surface 10c. Therefore, according to the present embodiment, it becomes possible to avoid an interference between the arm part 20 and either the rear side surface 10c or the front side surface 10d of the chassis 10, even in the case where each length of the arm part 18 through the arm part 20 is elongated and the rotation center C1 is made closer to a side of the FOUP 8. As a result of that, according to the present embodiment, it becomes possible to appropriately transfer the wafer 2.

OTHER EMBODIMENTS

Although the embodiment described above is an example of an embodiment according to the present invention, the present invention is not limited to the above embodiment and various variations and modifications can be made without changing the concept of the present invention.

Figure 3:
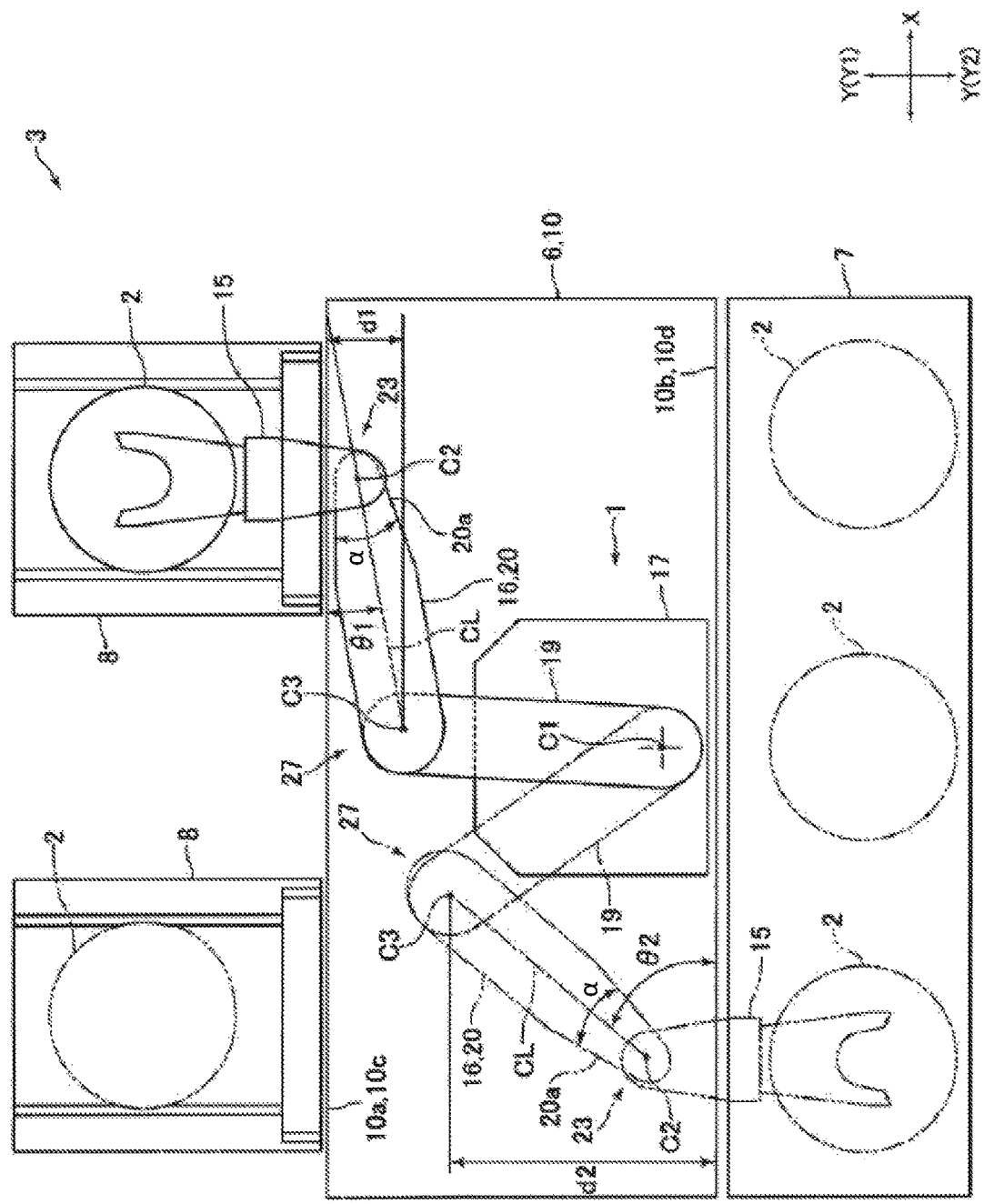
FIG. 3 is a schematic plan view of a semiconductor manufacturing system in which an industrial robot according to another embodiment of the present invention is used.
Figure 4:
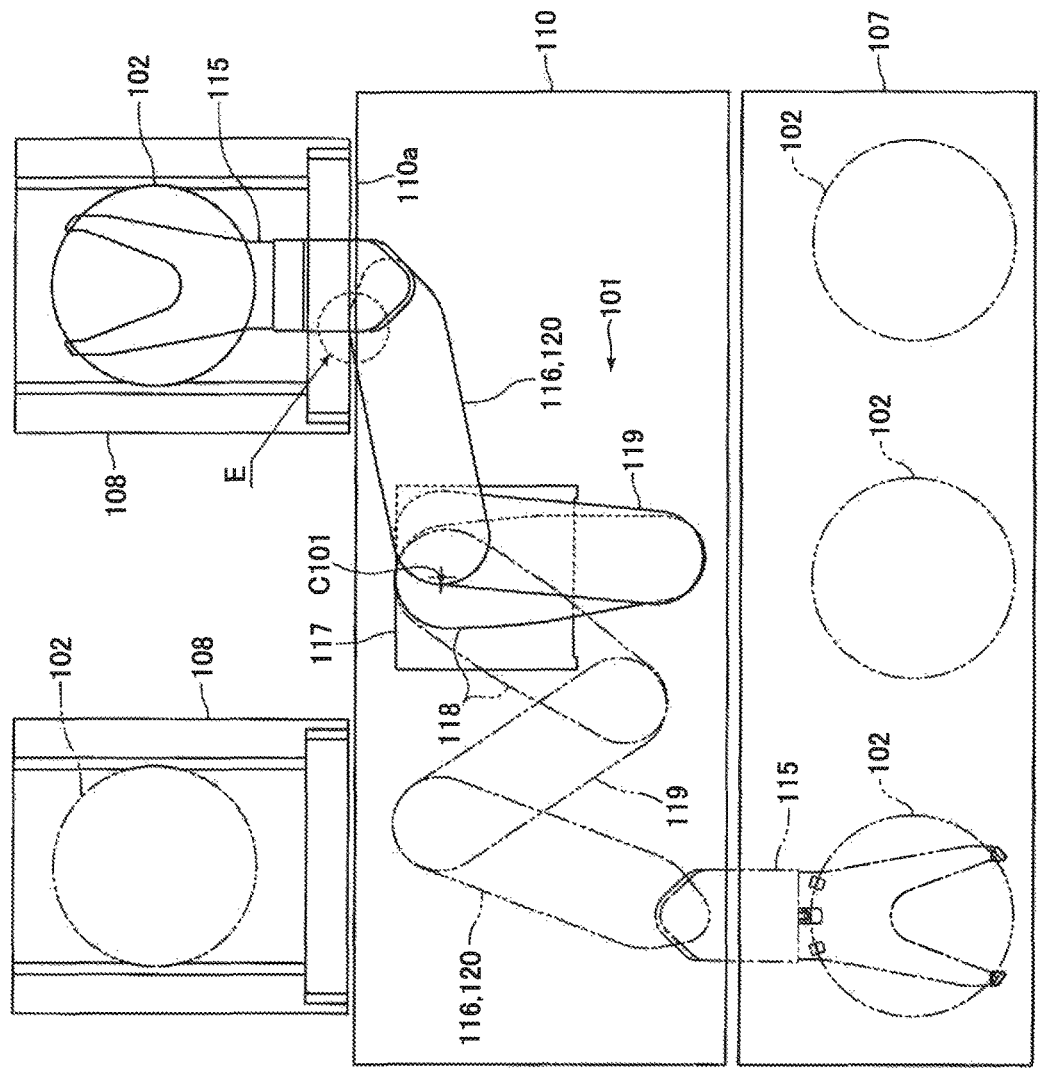
FIG. 4 is a schematic plan view of a semiconductor manufacturing system in which an industrial robot according to a conventional technology is used.

In the embodiment described above, the arm 16 is structured with three arm parts, i.e., the arm part 18 through the arm part 20. As another configuration, for example, the arm 16 may be configured with two arm parts, i.e., an arm part 19 and an arm part 20; wherein, the hand 15 is connected to a top end side of the arm part 20 in such a way as to be rotatable, and a root end side of the arm part 20 is connected to a top end side of the arm part 19 in such a way as to be rotatable, as shown in FIG. 3. In this case, a root end side of the arm part 19 is connected to the main body 17 in such a way as to be rotatable. Moreover, for example, in this case; a rotation center C1 of the arm part 19 in relation to the main body 17 (in other words, a rotation center of the arm 16 in relation to the main body 17) is placed at a rear side in relation to the center position of the chassis 10 in the back-and-forth direction. Incidentally, in FIG. 3, a configuration element being the same as in the embodiment described above is provided with the same reference numeral as in the above embodiment. Moreover, also in a modification shown in FIG. 3, the arm part 19 is a second top-end-side arm part, and the arm part 20 is a top-end-side arm part.

Relationships of formulas of "L×sin θ1<d1−R" and "L×sin θ2<d2−R" are also established in the modification shown in FIG. 3. Moreover, the first angle θ1 is smaller than the second angle θ2, and a relationship of a formula of "α=2×θ1" is established. Therefore, the same effect as in the above embodiment can be obtained in this modification as well.

Despite of the relationship of the formula of "α=2×θ1" in the above embodiment, a relationship of a formula of "α<2×θ1" may be established. Even in this case, it becomes possible to avoid an interference between the arm part 20 and either the rear side surface 10c or the front side surface 10d of the chassis 10 so that it becomes possible to appropriately transfer the wafer 2. Then, as shown in FIG. 2; wherein an outer diameter of the bearing unit 24 is represented as an outer diameter D1, and an outer diameter of the pulley 25 is represented as an outer diameter D2; in the case where the relationship of the formula of "α<2×θ1" is established, and the outer diameter D1 is greater than the outer diameter D2, the angle α is equal to or greater than an angle θ3 between two external common tangents TL that contact an outer periphery of the bearing unit 24 and an outer periphery of the bearing unit 28, in the view from the vertical direction. In other words, a relationship of a formula of "α≥θ3" is established in this case. Meanwhile, in the case of a relationship of a formula of "α=θ3", an entire section of the arm part 20 makes up, for example, a reducing-width part in which a width at a location gradually becomes narrower as the location closes toward the top end of the arm part 20, in such a way that the arm part 20 is not provided with the constant-width part 20b. In the meantime, in the case where the relationship of the formula of "α<2×θ1" is established, and the outer diameter D2 is greater than the outer diameter D1, the angle α is equal to or greater than an angle between two external common tangents that contact an outer periphery of the pulley 25 and the outer periphery of the bearing unit 28, in the view from the vertical direction.

Although the joint part 23 is equipped with the pulley 25 that transmits the power for turning the hand 15 with respect to the arm part 20 in the embodiment described above, the joint part 23 may be equipped with a gear, such as a spur gear, instead of the pulley 25. Then, where an outer diameter of the gear is represented as an outer diameter D3; in the case where the relationship of the formula of "θ<2×θ1" is established, and the outer diameter D1 is greater than the outer diameter D3, the angle θ is equal to or greater than the θ3, in the view from the vertical direction. Moreover, in the case where the relationship of the formula of "α<2×θ1" is established, and the outer diameter D3 is greater than the outer diameter D1, the angle α is equal to or greater than an angle between two external common tangents that contact an outer periphery of the gear and the outer periphery of the bearing unit 28, in the view from the vertical direction. Incidentally, the outer periphery of the bearing unit 28 is greater than the outer diameter of the gear.

Although the first angle θ1 is smaller than the second angle θ2 in the embodiment described above, sometimes the second angle θ2 may be smaller than the first angle θ1; depending on a location of the robot 1 in the chassis 10, a configuration of the robot 1, a control method of the robot 1, and the like. For example, in the case where the rotation center C1 is placed at a front side in relation to the center position of the chassis 10 in the back-and-forth direction, and the robot 1 is so placed as to be turned 90 degrees with respect to a vertical direction as a turning axis direction, from the status shown in FIG. 1, the second angle θ2 is smaller than the first angle θ1. In this case, a relationship of a formula of "α≤2×θ2" is established. Therefore, even in this case, the same effect as in the above embodiment can be obtained.

In the embodiment described above, the arm part drive mechanism collectively turns the arm part 18 and the arm part 19. As another configuration, for example, the robot 1 may be equipped with a drive mechanism for turning the arm part 18 and a drive mechanism for turning the arm part 19 separately.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An industrial robot for transferring a semiconductor wafer between a Front Open Unified Pod (FOUP) and a semiconductor wafer processing device, the industrial robot constituting a part of an Equipment Front End Module (EFEM), the industrial robot comprising:
 a main body;
 a hand structured to mount the semiconductor wafer; and
 an arm comprising a top end side and a root end side, the top end side being rotatably connected to the hand and the root end side being rotatably connected to the main body;
  wherein the arm comprises:
   a first top-end-side arm part having a top end side and a root end side; and
   a second top-end-side arm part having a top end side;
   wherein the hand is rotatably connected to the top end side of the first top-end-side arm part; and
   the root end side of the first top-end-side arm part is rotatably connected to the top end side of the second top-end-side arm part;
  the top end side of the first top-end-side arm part is a reducing-width part where a width gradually narrows in a direction from the root end side of the first top-end-side arm part to the top end side of the first top-end-side arm part when viewed from a vertical direction;
  a top end of the first top-end-side arm part is shaped so as to be approximately arcuate in the view from the vertical direction;
  the FOUP and the semiconductor wafer processing device are placed in such a way as to face each other across the EFEM in a first direction that is perpendicular to the vertical direction; and
  where a radius of curvature of the top end of the first top-end-side arm part in the view from the vertical direction is referred to as a radius R;
  an angle of the reducing-width part in the view from the vertical direction is referred to as an angle α;
  a flat wall surface being at a side toward the FOUP, which constitutes one internal surface, in the first direction, of a chassis of the EFEM housing the industrial robot, is referred to as a first wall surface;
  a flat wall surface being at a side toward the semiconductor wafer processing device, constituting the other internal surface, in the first direction, of the chassis of the EFEM, and being in parallel with the first wall surface, is referred to as a second wall surface;

a rotation center of the hand in relation to the first top-end-side arm part in the view from the vertical direction is referred to as a first rotation center;

a rotation center of the first top-end-side arm part in relation to the second top-end-side arm part in the view from the vertical direction is referred to as a second rotation center;

a line connecting the first rotation center and the second rotation center in the view from the vertical direction is referred to as an arm part center line;

a length of the arm part center line in the view from the vertical direction is referred to as a length L;

an angle of the arm part center line in relation to the first wall surface in the view from the vertical direction, at a time just after the industrial robot has finished bringing the semiconductor wafer into the FOUP, is referred to as a first angle $\theta 1$;

an angle of the arm part center line in relation to the second wall surface in the view from the vertical direction, at a time just after the industrial robot has finished bringing the semiconductor wafer into the semiconductor wafer processing device, is referred to as a second angle $\theta 2$;

a distance between the second rotation center and the first wall surface, in the first direction, at the time just after the industrial robot has finished bringing the semiconductor wafer into the FOUP, is referred to as a distance d1; and a distance between the second rotation center and the second wall surface, in the first direction, at the time just after the industrial robot has finished bringing the semiconductor wafer into the semiconductor wafer processing device, is referred to as a distance d2;

the following relationships are satisfied:

$$L \times \sin(\theta 1) < d1-R; \text{ and}$$

$$L \times \sin(\theta 2) < d2-R;$$

in a case where the first angle $\theta 1$ is smaller than the second angle $\theta 2$, the following relationship is satisfied:

$$\alpha \leq 2 \times \theta 1; \text{ and}$$

in a case where the second angle $\theta 2$ is smaller than the first angle $\theta 1$, the following relationship is satisfied:

$$\alpha \leq 2 \times \theta 2 \leq 2 \times \theta 2.$$

2. The industrial robot according to claim 1 further comprising:

a first joint part as a connection part connecting the first top-end-side arm part and the hand, the first joint part comprising a first bearing unit structured to support the hand in such a way as to make the hand rotatable in relation to the first top-end-side arm part, and a pulley or a gear structured to transmit the power in order to turn the hand in relation to the first top-end-side arm part, wherein in the case where the first joint part is provided with the pulley, a center of the pulley and a center of the first bearing unit coincide with the first rotation center in a view from the vertical direction, and, in the case where the first joint part is provided with the gear, a center of the gear and the center of the first bearing unit coincide with the first rotation center in the view from the vertical direction; and a second joint part as a connection part connecting the second top-end-side arm part and the first top-end-side arm part, with the second joint part comprising a second bearing unit structured to support the top-end-side arm part in such a way as to make the top-end-side arm part rotatable in relation to the second top-end-side arm part, wherein a center of the second bearing unit coincides with the second rotation center in the view from the vertical direction;

wherein an outer diameter of the first bearing unit is represented as an outer diameter D1, an outer diameter of the pulley is represented as an outer diameter D2, and an outer diameter of the gear is represented as an outer diameter D3, an outer diameter of the second bearing unit is greater than the outer diameter D1, the outer diameter D2, and the outer diameter D3;

in the case where the first joint part is provided with the pulley, and the outer diameter D1 is greater than the outer diameter D2, or in the case where the first joint part is provided with the gear, and the outer diameter D1 is greater than the outer diameter D3, the angle $\alpha$ is equal to or greater than an angle between two external common tangents that contact an outer periphery of the first bearing unit and an outer periphery of the second bearing unit, in the view from the vertical direction;

in the case where the first joint part is provided with the pulley, and the outer diameter D2 is greater than the outer diameter D1, the angle $\alpha$ is equal to or greater than an angle between two external common tangents that contact an outer periphery of the pulley and the outer periphery of the second bearing unit, in the view from the vertical direction; and in the case where the first joint part is provided with the gear, and the outer diameter D3 is greater than the outer diameter D1, the angle $\alpha$ is equal to or greater than an angle between two external common tangents that contact an outer periphery of the gear and the outer periphery of the second bearing unit, in the view from the vertical direction.

3. The industrial robot according to claim 2;

wherein the arm comprises three arm parts including the first top-end-side arm part, the second top-end-side arm part, and a root-end-side arm part;

wherein a root end side of the second top-end-side arm part is rotatably connected at a top end side of the root-end-side arm part.

4. The industrial robot according to claim 1;

wherein the arm comprises three arm parts including the first top-end-side arm part, the second top-end-side arm part, and a root-end-side arm part;

wherein a root end side of the second top-end-side arm part is rotatably connected at a top end side of the root-end-side arm part.

* * * * *